(12) United States Patent
Hu et al.

(10) Patent No.: US 9,389,625 B2
(45) Date of Patent: Jul. 12, 2016

(54) DC-DC CONVERTER CONTROLLER APPARATUS WITH DUAL-COUNTER DIGITAL INTEGRATOR

(71) Applicant: Texas Instruments Incorporated, Dallas, TX (US)

(72) Inventors: Zhiming Hu, Shenzhen (CN); Tetsuo Tateishi, Aichi (JP); Xuening Li, Dongguan (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 86 days.

(21) Appl. No.: 14/514,433

(22) Filed: Oct. 15, 2014

(65) Prior Publication Data

US 2015/0338866 A1 Nov. 26, 2015

Related U.S. Application Data (63) Continuation of application No. PCT/CN2014/078117, filed on May 22, 2014.

(51) Int. Cl.
| | |
|---|---|
| *H02M 3/335* | (2006.01) |
| *G05F 1/575* | (2006.01) |
| *H02M 3/157* | (2006.01) |
| *H03M 5/08* | (2006.01) |

(52) U.S. Cl.
CPC .............. *G05F 1/575* (2013.01); *H02M 3/157* (2013.01); *H03M 5/08* (2013.01)

(58) Field of Classification Search
CPC .............. G05F 1/10; G05F 1/46; G05F 1/56; G05F 1/565; G05F 1/575; H02M 3/155; H02M 3/156; H02M 3/157; H02M 3/158
See application file for complete search history.

(56) References Cited

U.S. PATENT DOCUMENTS

| | | | |
|---|---|---|---|
| 5,912,552 A | 6/1999 | Tateishi | |
| 6,057,675 A | 5/2000 | Tateishi | |
| 6,140,801 A | 10/2000 | Aoki et al. | |
| 6,348,783 B2 | 2/2002 | Tateishi | |

(Continued)

FOREIGN PATENT DOCUMENTS

| | | |
|---|---|---|
| CN | 1765055 A | 4/2006 |
| CN | 102522991 A | 6/2012 |

OTHER PUBLICATIONS

PCT Search Report for PCT/CN2014/078117, mailed Feb. 6, 2015.

(Continued)

*Primary Examiner* — Jeffrey Gblende
(74) *Attorney, Agent, or Firm* — William B. Kempler; Frank D. Cimino (57) ABSTRACT

DC-DC converter PWM controllers and dual counter digital integrators are presented for integrating an error between a reference voltage signal and a feedback voltage signal, in which a comparator, dual counters, and a DAC are used to provide a compensated reference to a modulator loop comparator which generates a PWM switching signal for controlling a power converter output voltage, with the second counter being selectively incremented or decremented when the first counter output indicates a predetermined value after the first counter output transitions in one direction through a predetermined count range to enhance loop stability, and a startup mode control allows fast integrator operation during initialization, with the ability to freeze integrator operation during overcurrent conditions.

20 Claims, 7 Drawing Sheets

(56) References Cited

U.S. PATENT DOCUMENTS

| | | | |
|---|---|---|---|
| 6,348,833 | B1 | 2/2002 | Tsujimoto et al. |
| 6,469,481 | B1 | 10/2002 | Tateishi |
| 6,642,696 | B2 | 11/2003 | Tateishi |
| 6,812,676 | B2 | 11/2004 | Tateishi |
| 6,924,633 | B2 | 8/2005 | Sanzo et al. |
| 6,977,488 | B1 | 12/2005 | Nogawa et al. |
| 6,989,999 | B2 | 1/2006 | Muramatsu et al. |
| 7,479,840 | B2 | 1/2009 | Nielsen |
| 7,595,624 | B2 | 9/2009 | Tateishi et al. |
| 7,652,461 | B2 | 1/2010 | Tateishi |
| 7,872,456 | B2 | 1/2011 | Li et al. |
| 8,058,860 | B2 | 11/2011 | Tateishi |
| 8,269,570 | B2 | 9/2012 | Li et al. |
| 8,476,887 | B2 | 7/2013 | Tateishi et al. |
| 8,497,793 | B2 | 7/2013 | Lu |
| 8,587,967 | B2 | 11/2013 | Cohen |
| 2001/0022512 | A1 | 9/2001 | Tateishi |
| 2004/0085048 | A1 | 5/2004 | Tateishi |
| 2006/0119340 | A1* | 6/2006 | Tateishi ............. H02M 3/1588 323/284 |
| 2008/0303501 | A1* | 12/2008 | Prodic .................. H02M 3/157 323/283 |
| 2010/0001702 | A1* | 1/2010 | Tateishi ............. H02M 3/1588 323/282 |
| 2014/0361755 | A1* | 12/2014 | Tateishi ................ H02M 3/158 323/271 |

OTHER PUBLICATIONS

CN1765055A English Machine Translation (18 pages).
CN102522991A English Machine Translation (11 pages).
Texas Instruments TPS51367, "22-V Input, 12-A Integrated FET Converter With Ultra-Low Quiescent (ULQTM)", www.ti.com, SLUSBB7A, Mar. 2013, Revised Jun. 2013, 33 pgs.
Zhang et al., Texas Instruments, "D-CAP Mode With All-Ceramic Output Capacitor Application", Application Report, SLVA453, Feb. 2011, 9 pgs.

* cited by examiner

DC-DC CONVERTER CONTROLLER APPARATUS WITH DUAL-COUNTER DIGITAL INTEGRATOR

REFERENCE TO RELATED APPLICATIONS

This application is a continuation of, and claims priority to and the benefit of, International Application No PCT/CN2014/078117, filed May 22, 2014 and entitled "DC-DC CONVERTER CONTROLLER APPARATUS WITH DUAL-COUNTER DIGITAL INTEGRATOR", the entirety of which is hereby incorporated by reference.

FIELD OF THE INVENTION

The present disclosure relates to control of DC to DC converters and more particularly to DC-DC converter controller apparatus with dual-counter digital integrator circuitry.

BACKGROUND

Voltage regulators and DC to DC converters are typically required to provide stable, regulated supply voltages for proper operation of processors, ASICS, memory, and other components in modern electronic circuits. Computers, smart phones, tablets, and other electronic products in particular require highly accurate supply voltages for operation of processors and other internal circuitry. DC to DC converter controllers typically provide closed loop converter operation to maintain a generally constant output voltage during initial power up, load transients, overcurrent conditions, and steady state operation. Switching converters typically include one or more switching devices operated by pulse width modulated switching control signals, and a common form of pulse width modulation (PWM) employs a generally fixed switching frequency with the controller modifying the width or duration of the switching control signal pulses to regulate the output voltage according to a feedback signal. Fixed frequency DC to DC conversion, however, suffers from voltage regulation limitations in the presence of abrupt changes in load current. Even in steady state operation, supply voltage accuracy is adversely impacted by offsets in the PWM comparator circuitry, current signal variation and reference divider errors, and analog integrator circuits are often employed to compensate system offsets. However, analog integrators require an external capacitor and occupy large amounts of integrated circuit die, and also suffer from high power consumption and finite time constants, leading to poor output regulation during load transients. Moreover, turning off analog integrators during transitions between discontinuous conduction mode (DCM) and continuous conduction mode (CCM) leads to instability as integration values stored as voltages across integrator capacitors discharge over time. Thus, analog integrator solutions require sacrifice of load efficiency by shutdown of analog integrators in light load condition, or may provide acceptable light-load efficiency and accuracy by reducing power from other functional block in the system. Digital integrators occupy less area and use less power than analog integrators, but digital integrators using a digital up/down counter suffer from loop stability problems, particularly for load transient conditions. Accordingly, a need remains for improved pulse width modulation controllers and DC to DC converters for improved regulation accuracy with better loop stability than traditional approaches.

SUMMARY

The present disclosure provides DC to DC converter and controller embodiments with novel digital integrators using multiple counters that may be advantageously employed to facilitate stable accurate operation with integration to compensate for loop comparator and other PWM control circuit offsets.

A DC to DC converter is disclosed, including a switching circuit, a modulator, a feedback circuit and a loop comparator circuit providing an output signal to the modulator to regulate an output voltage based on a feedback voltage signal and a compensated reference signal. The DC to DC converter also includes a digital integrator circuit with a comparator circuit comprising a first input coupled to receive an integrator reference voltage signal, a second input coupled to receive a feedback voltage signal, and a comparator output providing an output signal indicating whether the reference voltage is greater than the feedback voltage. The digital integrator includes a dual counter circuit with first and second multi-bit counters. A clock input of the first counter is coupled with an integrator circuit clock source, and an up/down count input of the first counter is coupled to receive the comparator output, with the first counter having a plurality of first counter bit outputs providing signals indicating a multi-bit first counter output value. A logic circuit initially increments or decrements the second counter in response to the first counter bit outputs initially indicating a predetermined first counter value, and thereafter increments or decrements the second counter in response to the first counter bit outputs again indicating the predetermined value after the first counter bit outputs transition in one direction through a full value range of the first counter. A digital to analog converter (DAC) is provided, including a plurality of inputs connected to the second counter bit outputs, and an output controlling the compensated reference signal provided to the second comparator input based at least partially on the second counter bit outputs and the reference voltage. The provision of two separate counters with controlled incrementing or decrementing of the second counter in certain embodiments may be employed to advantageously control the bandwidth or response time of the integrator for enhanced stability to thereby enhance stable accurate DC to DC converter operation.

Switches may be included in certain embodiments to selectively connect the clock and up/down count inputs of the second counter to the logic circuit for normal or steady state operation, and to alternatively connect the second counter up/down count input to the comparator output and to connect the clock input of the second counter to the integrator circuit clock source in a second mode. This further aspect of certain embodiments may facilitate fast transition of the compensated reference signal to a correct value during startup of the DC to DC converter.

One or both of the counters may include inputs in certain embodiments to receive a hold control input signal and operate in a first mode to selectively update their respective counter outputs according to a corresponding clock and up/down count inputs, and in a second mode to refrain from updating their respective counter bit outputs. Such embodiments may be advantageously used to freeze or hold the integration value in situations where the feedback is known or believed to be incorrect, such as overcurrent limit situations, overvoltage situations, etc.

Pulse width modulation (PWM) controller embodiments are provided in accordance with further aspects of the disclosure, including a reference compensation circuit providing a compensated reference signal at least partially according to a multi-bit digital input and a reference voltage, as well as a loop comparator circuit for controlling a power converter output voltage based on a feedback voltage and the compensated reference signal, and a digital integrator circuit. The digital integrator circuit includes a comparator circuit providing a binary comparator output signal indicating whether a reference voltage signal is greater than a feedback voltage signal, as well as a dual counter circuit with first and second counters and a logic circuit. The first counter receives the comparator output signal and an integrator clock input signal, and provides a multi-bit first counter value, and the second counter provides the multi-the digital input to the reference compensation circuit. The logic circuit initially increments or decrements the second counter based on the first counter value indicating a predetermined value, and thereafter selectively increments or decrements the second counter in response to the first counter value incrementing or decrementing through a predetermined multi-bit count range.

The predetermined multi-bit count range in certain embodiments is a full range of the first counter. In certain embodiments, moreover, a first switch is provided, which is operative according to a control input in a first state to connect the second clock input to the logic circuit, and in a second state to connect the second clock input to the integrator clock input signal, and a second switch is provided which is operative according to the control input in a first state to connect the second up/down count input to the logic circuit, and in a second state to connect the second up/down count input to the comparator output. The second counter in certain embodiments includes a hold control input for freezing the digital input provided to the reference compensation circuit. Certain embodiments, moreover, include an overcurrent limit circuit operative to selectively provide a hold signal to the hold control input of the second counter to freeze the multi-bit digital input provided to the reference compensation circuit when an overcurrent limit condition is detected. The reference compensation circuit in certain embodiments includes a switched resistive divider circuit with switches operated according to the multi-bit digital input to provide the compensated reference signal at least partially according to the multi-bit digital input and the reference voltage.

A digital integrator circuit is provided in accordance with further aspects of the disclosure for integrating an error between a reference voltage signal and a feedback voltage signal. The digital integrator includes a comparator circuit with an output providing a binary comparator output signal indicating whether the reference voltage signal is greater than the feedback voltage signal, along with first and second counters and a logic circuit. The first counter comprises a first clock input coupled with an integrator circuit clock source, a first up/down count input coupled to receive the comparator output signal, and a plurality of first counter bit outputs providing signals indicating a multi-bit first counter output value. The second counter comprises a second clock input, a second up/down count input, a plurality of second counter bit outputs providing signals indicating a multi-bit second counter output value, and a hold control input for freezing the second counter bit outputs. The logic circuit is operative to initially increment or decrement the second counter responsive to the first counter bit outputs initially indicating a predetermined value. Thereafter the logic circuit increments or decrements the second counter only in response to the first counter bit outputs again indicating the predetermined value after the first counter bit outputs transition in one direction through a full value range of the first counter. The digital integrator in certain embodiments includes a first switch operative according to a control input in a first state to connect the clock input of the second counter to the logic circuit, and in a second state to connect the second clock input of the second counter to the integrator circuit clock source, as well as a second switch operative according to the control input in a first state to connect the second up/down count input to the logic circuit, and in a second state to connect the second up/down count input to the comparator output.

DESCRIPTION OF THE DRAWINGS

The following description and drawings set forth certain illustrative implementations of the disclosure in detail, which are indicative of several ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

One or more embodiments or implementations are hereinafter described in conjunction with the drawings, wherein like reference numerals are used to refer to like elements throughout, and wherein the various features are not necessarily drawn to scale.

Figure 1:
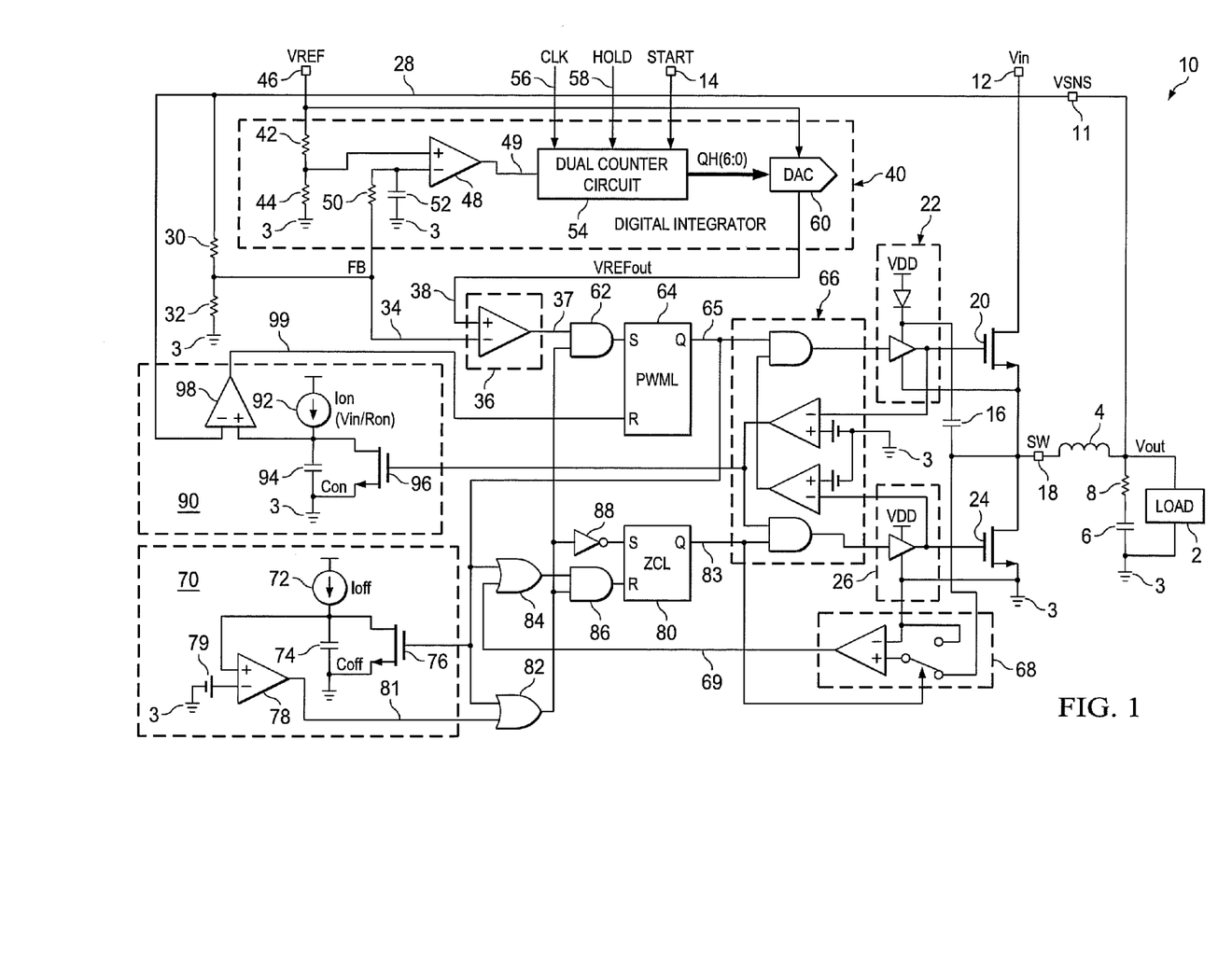
FIG. 1 is a schematic diagram illustrating a DC to DC converter with a dual counter digital integrator circuit providing a compensated reference voltage to a modulator circuit loop controller in accordance with one or more aspects of the present disclosure.

FIG. 1 illustrates a DC to DC converter 10 for providing an output voltage Vout to drive an associated load 2 connected between a converter output terminal and a circuit ground 3, where the converter 10 in this non-limiting example is a buck converter with an output inductor 4 connected between a switching node SW and the output terminal. An output capacitor 6 having an associated equivalent series resistance (ESR) 8 is connected between the output terminal and the circuit ground 3 in parallel with the driven load 2. The illustrated DC to DC converter 10 provides a modulator operating at a pseudo constant frequency, although constant frequency or pseudo constant frequency operation is not a strict requirement of all embodiments. General operation of suitable modulators and associated circuitry is described in U.S. Pat. Nos. 6,642,696, 7,652,461, and 8,476,887, the entireties of which are hereby incorporated by reference. The DC to DC converter 10 in FIG. 1 includes a switching circuit comprising upper and lower field effect transistor (FET) switching devices 20 and 24 (NMOS in this example) connected between an input supply voltage Vin and the circuit ground 3 and the switches 20 and 24 are connected to one another at the switching node SW. Any suitable switching circuitry can be employed having at least one switch connected to the switching node for selective operation according to at least one corresponding switching control signal. In the illustrated example, high and low driver circuits 22 and 26, respectively, provide switching control signals to the switches 20 and 24, respectively, based on a modulated output signal 65 from a PWM latch flip-flop 64 (PWML), where the latch 64 provides an input signal to a cross conduction control circuit 66 which in turn provides inputs to the drivers 22 and 26 for complementary pulse width modulation operation of the high and low switching devices 20 and 24 to control the output voltage Vout provided to the load 2.

In certain embodiments, the pulse width modulation control of the DC to DC converter 10 is provided via a PWM controller integrated circuit (IC), which may but need not include the switches 20 and 22, and which provides a terminal 18 for connection of an external output inductor 4. A voltage sense (VSNS) input terminal 11 may be provided for connection to a sensed voltage node 28 to sense the DC to DC converter output voltage Vout and an input voltage terminal 12 can be included for receiving the input voltage Vin as schematically shown in FIG. 1. Other embodiments are possible in which the switching devices 20 and 24 and/or the associated drivers 22 and 26 may be external to the controller IC, and the IC may include suitable terminals for connecting such components to the internal modulator circuitry. In addition, while the illustrated example includes both high and low drivers 22 and 26 and associated switching devices 20 and 24, the low-side switch 24 and the corresponding driver 26 may be omitted in certain implementations, with a diode being connected between the switching node SW and the circuit ground 3. Furthermore, while the DC to DC converter 10 in FIG. 1 is a buck type converter, the various concepts of the present disclosure may be employed in connection with any suitable form of DC to DC converter or voltage regulator, including without limitation buck converters, boost converters, buck-boost converters, CUK converters, etc. In the illustrated embodiment, moreover, an externally controllable START signal may be provided to the controller IC via a corresponding terminal 14, or a startup control signal may be internally generated using timers or other circuitry (not shown) in the controller IC in various embodiments. The PWM control circuitry generally operates in a normal mode to regulate the output voltage Vout according to a reference voltage VREF, which is an external input signal provided to the PWM controller IC in the illustrated embodiment via a reference voltage terminal 46.

The PWM latch 64 forms a modulator circuit as part of a PWM controller together with the drivers 22, 26, any included cross conduction control circuit 66, and a loop comparator 36. The loop comparator 36 provides a loop comparator output 37 to the set input "S" of the latch 64 through an AND gate 62 to regulate the converter output voltage Vout based on a feedback signal (FB) connected to a non-inverting first comparator input 34 and on a compensated reference signal VREFout provided to a non-inverting loop comparator input 38 from a digital integrator 40 described further below. The feedback signal FB in this case is provided by a resistive divider feedback circuit including upper and lower resistors 30 and 32 connected between the output voltage sense signal VSNS at node 28 and the circuit ground 3, with a center node of the divider 30, 32 providing the feedback voltage signal FB to the loop comparator circuit 36 and to the digital integrator 40 as a fraction of the sensed output voltage Vout.

In the illustrated example, the output 65 ("Q") of the PWM latch 64 is provided as an input to the cross conduction control circuit 66, as well as to a minimum off-time timer circuit 70, and to OR gates 82 and 84. The timer circuit 70 includes a current source 72 (Ioff) connected between a positive supply voltage and an upper terminal of an off-time timer capacitor 74 (Coff) whose lower terminal is connected to the circuit ground, with an NMOS transistor 76 receiving the PWM latch output 65 and selectively shorting (e.g., discharging) the voltage across the capacitor 74 in response. The current source 72 and the capacitor 74 thereafter provide a rising voltage signal to a non-inverting input of a comparator 78 which is compared with a reference voltage 79 such that the comparator 78 provides an output signal to an input of the OR gate 82. The output of the OR gate 82 is provided as a second input to the AND gate 62 for controlling the S input of the PWM latch 64 to thereby control the minimum amount of time that the PWM latch output signal 65 is off.

As further seen in FIG. 1, a zero crossing comparator circuit 68 compares the voltage at the switch node SW with the circuit ground and provides a zero crossing signal 69 as a second input to the OR gate 84. The OR gates 82 and 84 provide inputs to an AND gate 86 whose output controls a reset "R" input to a zero crossing latch (ZCL) 80 having a set "S" input driven through an inverter 88 by the output of the OR gate 82 as shown. In the illustrated embodiment, moreover, the cross conduction control circuit 66 compares the output of the driver 22 with a reference voltage to provide an output signal controlling an on-time timer circuit 90 including a current source 92 (Ion, which is set in certain implementations to be a ratio of the input voltage Vin to an external control resistor Ron), a timing capacitor 94 (Con), a control transistor 96, and a comparator 98 which compares a rising voltage across the capacitor 94 with the sensed output voltage 28 and provides an output signal 99 to the reset "R" input of the PWM latch to control the on-time of the PWM switching signals provided to the drivers 22 and 26. The PWM control circuitry thus provides a closed-loop modulator to control the DC to DC converter output voltage Vout provided to the load 2.

Figure 2:
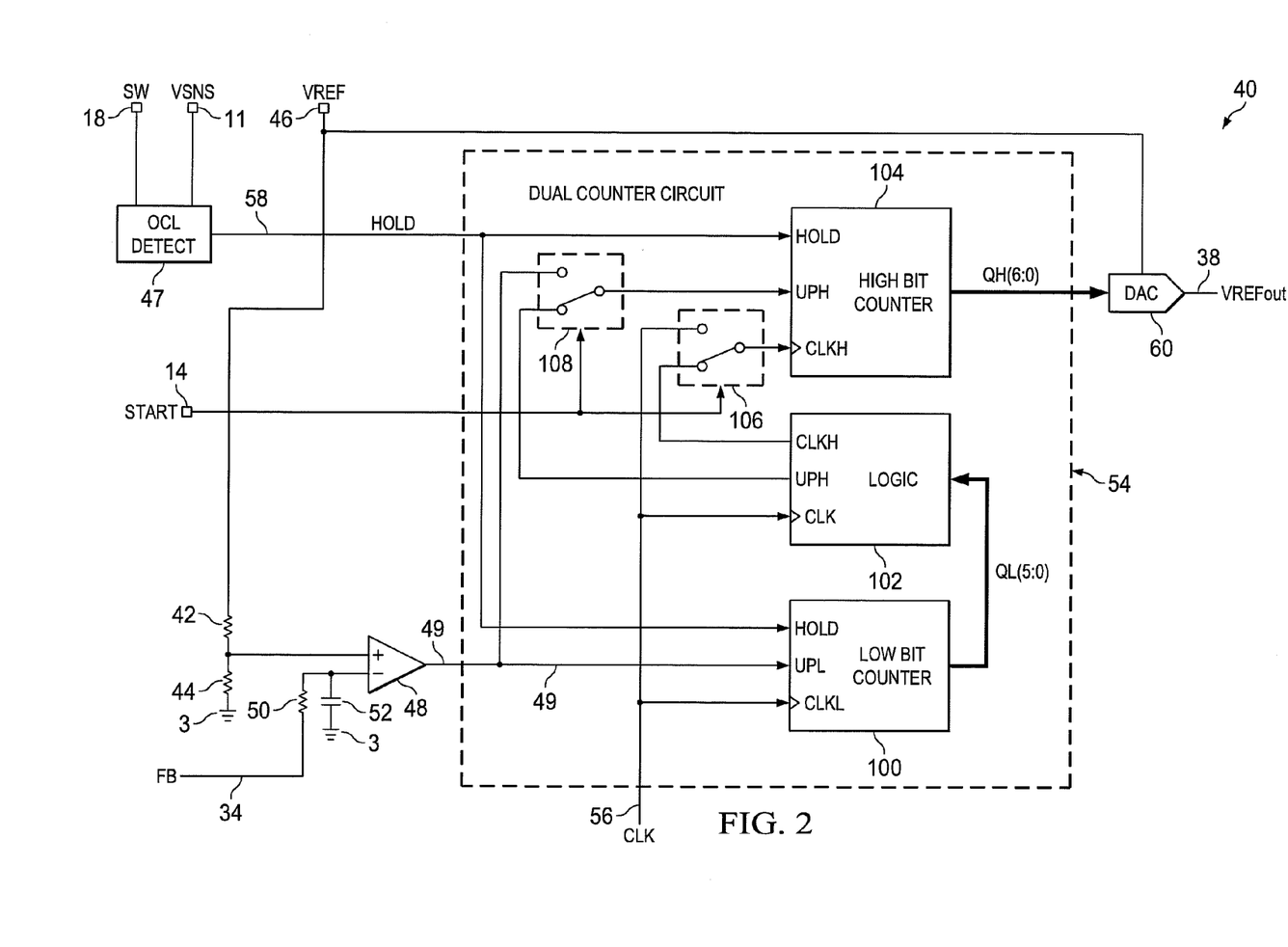
FIG. 2 is a schematic diagram illustrating further details of a dual counter circuit in the digital integrator.

Referring now to FIGS. 1 and 2, the loop comparator 36 has a first input 34 connected to receive the feedback voltage signal FB, as well as a second comparator input 38 connected to receive a compensated reference signal VREFout from the digital integrator circuit 40. In order to compensate for offsets in the modulator circuitry, such as loop comparator offsets, resistor divider offsets, etc., the integrator 40 receives the reference signal VREF and the feedback signal FB, and provides the compensated reference signal VREFout to the loop comparator 36. The digital integrator 40 includes a resistive divider reference circuit with an upper resistor 42 and a lower resistor 44 connected in series with one another between the reference input VREF and the circuit ground 3, and provides an integrator reference signal to a non-inverting input of an integrator comparator 48. The inverting input of the comparator 48 is coupled to receive the feedback signal FB through an optional RC filter circuit including a resistor 50 and a capacitor 52 as shown. The comparator output 49 generates a binary comparator output signal indicating whether the reference voltage signal is greater than the feedback voltage signal FB. The comparator output 49 is provided as an input signal to a dual counter circuit 54 which in turn provides a 7-bit binary-coded digital output QH(6:0) to a digital to analog converter (DAC) 60. The DAC 60 receives the reference voltage VREF and the digital counter output and provides the compensated reference voltage VREFout to the non-inverting input 38 of the loop comparator 36.

In the illustrated embodiment, the dual counter circuit 54 also receives a HOLD control signal 58 and an integrator clock signal 56 (CLK). Any suitable clock source may be used as the integrator clock signal 56. For example, a PWM clock used for operating the PWM latch 64 may be used, although various implementations are possible using a separate clock source 56 for operating the digital integrator 40. In one possible embodiment, the HOLD signal 58 is provided as an output from an overcurrent limit (OCL) detection circuit 47 as shown in FIG. 2, where the circuit 47 detects overcurrent conditions in the DC to DC converter 10 based on the voltages at the switching node SW and the output voltage sense signal VSNS. The HOLD signal 58 may be provided alternatively or in combination according to other conditions in the DC to DC converter circuit 10, including without limitation over voltage conditions, etc. In particular, the HOLD signal 58 advantageously freezes the value of the digital integrator 40, and thus provides utility in overcurrent limit and/or other situations where the sensed output voltage, and hence the feedback signal FB are believed to be inaccurate.

As best seen in FIG. 2, the dual counter circuit 54 includes a first counter 100 (e.g., a low bit counter in this example) with a clock input CLKL receiving the integrator circuit clock source CLK, as well as a first up/down count input UPL coupled to receive the output signal 49 from the comparator 48. The first counter 100 provides a 6-bit output QL(5:0), although any multi-bit first counter 100 can be used having 2 or more binary outputs providing signals indicating a multi-bit first counter output value. The dual-counter circuit 54 further includes a logic circuit 102 and a multi-bit second counter 104 (e.g., a high bit counter) with a second clock input CLKH, a second up/down count input UPH, and a plurality of second counter bit outputs QH(6:0) providing signals indicating a 7-bit second counter output value to the DAC 60 for generating the compensated reference voltage VREFout. While a 7-bit second counter 104 is shown in the illustrated embodiment, other embodiments are possible in which the second counter 104 provides a multi-bit counter output of any number of bits.

Figure 3:
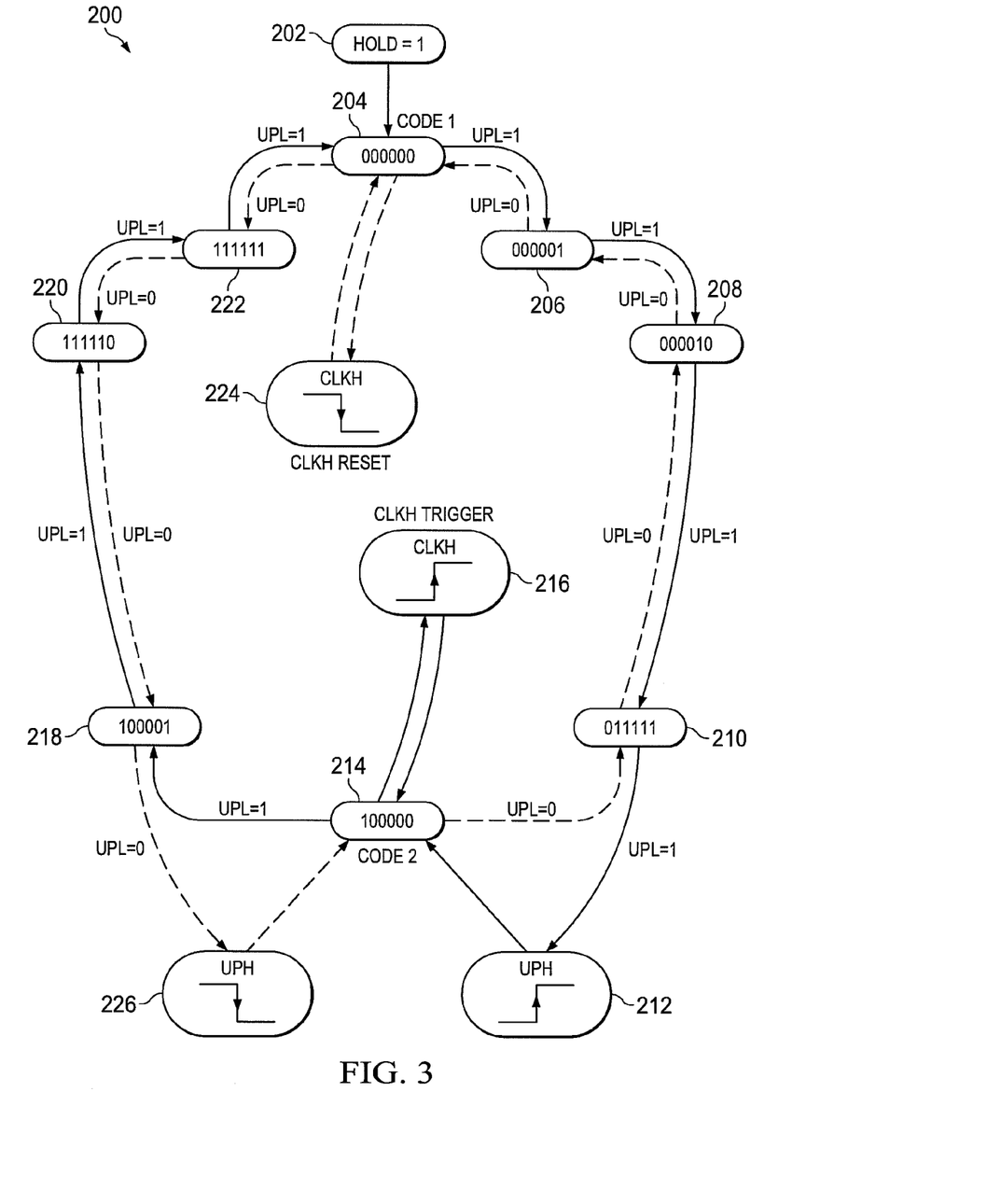
FIG. 3 is a state diagram illustrating operation of a logic circuit in the digital integrator.

Referring also to FIG. 3, the logic circuit 102 in one embodiment includes or otherwise implements a state machine operative to initially increment or decrement the second counter 104 in response to the first counter bit outputs QL(5:0) initially indicating a predetermined value 100000 of the first counter 100. Any suitable predetermined value can be used, and the value 100000 is just one non-limiting example. Moreover, the predetermined value (or the first and second predetermined values and predefined range described below) can be programmable in certain embodiments. In this regard, the logic circuit 102 can be any suitable fixed or programmable logic circuitry including synchronous circuits, flip-flops, logic gates, registers, etc. or combinations thereof. The logic circuit 102 has a plurality of inputs coupled to receive the counter output from the first (low bit) counter 100, as well as a first logic output (CLKH) coupled with the second clock input CLKH (e.g., directly or through a switch 106 as shown in FIG. 2), and a second logic output coupled with the second up/down count input UPH (e.g., directly or via a switch 108). As explained further below, the switches 106 and 108 are provided in the illustrated dual counter circuit embodiment 54 to selectively control connection of the clock and up/down counter inputs to the second counter 104 for selective operation in a normal mode and a "startup" mode according to the START signal 14.

In normal operation with the second counter clock input CLKH connected through the switch 106 to the first logic output of the logic circuit 102 and with the UPH counter input connected through the switch 108 to the second logic output, and after the first update of the high bit counter 104, the logic circuit 102 selectively increments or decrements the second counter 104 in response to the first counter bit outputs QL(5:0) again indicating the predetermined value 100000 after the first counter bit outputs QL(5:0) transition in one direction, either up or down, through a predetermined value range. In the illustrated embodiment, the predetermined multi-bit counter range is the full range of the first counter 100, although the logic circuit 102 can be constructed so as to implement any predetermined range representing two or more counts (up or down) of the first counter 100. In certain implementations, moreover, the logic circuit 102 is operative to selectively increment or decrement the second counter 104 in response to the first counter 100 undergoing a continuous transition in one direction through the predetermined value range without changing direction, although not a strict requirement of all embodiments.

FIG. 3 illustrates a state diagram 200 showing operation of one embodiment of the logic circuit 102 with an active low HOLD signal being placed at and an active "1" state at 202. Once the HOLD signal 58 goes low to start normal operation, the logic circuit 102 begins at a first counter value or code 000000 (CODE 1 in FIG. 3) at an initial first counter value or state 204. Upon the first counter value reaching this first predetermined value 000000, the logic circuit 102 sets the first logic output (CLKH) to a first binary clock input state (LOW) at state 224 to reset the clock input to the second counter 104 through the switch 106. From the initial state 204, the first counter 100 operates according to the clock input 56 and the up/down input 49 from the integrator circuit comparator 48 to count up or down at each active edge of the low bit clock CLKL, where the first counter 100 increments or counts up (clockwise in the figure) at the designated clock edge for UPL=1 and decrements or counts down (counterclockwise) for UPL=0.

Only several of the many possible first counter values or states are illustrated in FIG. 3, including a first state 206 (000001) entered by an up count from the initial state 204, a next upward value or state 208 (00010), with continued incrementing leading to a state 210 (011111). In this case, a subsequent upward count of the first counter 100 (UPL=1) causes the logic circuit 102 to transition through state 212 to a second predetermined value or state 214 (CODE 2 in FIG. 3 with a count value 100000), with the logic circuit 102 setting the second logic output (UPH) to a second binary counter state (HIGH) at state 212 in response to the first counter bit outputs QL(5:0) transitioning upward to the second predetermined value 100000. Also, the logic circuit in this upward counting example sets the first logic output (CLKH) to a second binary clock input state (HIGH) date 216 in order to trigger the clock input of the second counter 104 in response to the first counter 100 counting up to the second predetermined value 100000.

In the illustrated digital integrator 40, this upward counting of the first counter 100 followed by the selective triggering of the second counter 104 in response to the first counter reaching the predetermined count value 100000 increments the second counter 104 and thus increments the count value QH(6:0) provided to the DAC 60, thereby raising the compensated reference voltage VREFout. Closed loop operation of the loop comparator 36, in turn, compares VREFout with the feedback signal FB and modifies the modulation of the PWM control circuitry accordingly, thereby increasing the DC to DC converter output voltage Vout, causing an increase in the feedback signal FB provided as an input to the digital integrator 40. The result of this compensated reference voltage and converter output adjustment may or may not change the comparator output 49 from the integrator comparator 48. If not, the first counter 100 will continue to count upwards (clockwise in FIG. 3) from state 214 to state 218, and this upward counting (UPL=1) may continue through the illustrated states 220 and 222, with the counter 100 possibly again reaching the first predetermined value 000000 at state 204. In this case, the logic circuit 102 again sets the first logic output low in order to reset the second counter clock CLKH at state 224, and the logic circuit 102 continues the above-described operation for any further upward counting of the first counter 100.

If the relative comparison of the reference signal and the adjusted feedback signal by the integrator comparator 48 changes the state of the comparator output 49, the first counter 100 will instead count downward (UPL=0), with such downward counting occurring in a counterclockwise direction in the state diagram 200 of FIG. 3. In this case, downward transition from the state 218 (first counter value 100001) to the second predetermined value 100000 causes the logic circuit 102 to change the up/down signal (LOW) provided through the switch 108 to the UPH input of the second counter 104 at state 226, and in response to the counter 100 reaching the 100000 value at state 214 in a downward direction causes the logic circuit 102 to again trigger the clock input CLKH of the second counter 104 through the switch 106 at state 216 (high-going pulse edge), thereby decrementing the count value of the second counter 104. Further counting in the downward direction in this example causes the state diagram 200 to transition back through states 210, 208 and 206, possibly again reaching the first predetermined value 000000 at 204, and downward counting operation of the first counter 100 results in the logic circuit operation as described above. Thus, the second counter is selectively incremented or decremented in the normal mode operation in response to counting operation of the first counter 100 in one direction (or the other) over a predetermined count range (e.g., the full range in this example).

By this operation, the logic circuit 102 selectively controls the incrementing or decrementing of the second (high bit) counter 104, which in turn controls the adjustment of the count value provided to the DAC 60. In this manner, the dual counter circuit 54 damps or slows the response time of the digital integrator 40, thereby facilitating stable operation in the DC to DC converter 10, while facilitating the advantages of a digital integrator compared with traditional analog integrator circuitry (e.g., reduced integrated circuit die space, reduced power consumption, digital integrator value retention, etc.). In this regard, the compensated reference voltage VREFout will be stable as the output of the second counter 104 is not changed until the first counter 100 transitions through a predefined count range, in this case a full range of the first counter 100. Other embodiments of the logic circuit 102 may be implemented to provide different response time constants for the digital integrator 40, for example, by implementing a different predefined range of count values of the first counter 100 to set the responsiveness of the second counter 104.

Moreover, certain implementations of the logic circuit 102 are possible in which the second counter 104 is incremented or decremented only if a predefined range of count values is achieved in the first counter 100 continuously. In this regard, such embodiments may increment the second counter 104 only after the first counter 100 continuously counts upward (without any downward counts) through a predetermined range of count values, and decrements the second counter 104 only after the first counter 100 continuously counts downward (without any upward counts) through the predetermined range. Furthermore, different predefined ranges can be implemented in certain embodiments for upward counting and downward counting, although a single range can be used for counting in both directions as in the illustrated embodiment. Moreover, the logic circuit 102 may be configurable or programmable (e.g., through external communications, or via an input pin on a PWM controller integrated circuit, etc.) for selective adjustment of the predefined value range, thereby allowing dynamic adjustment of the responsiveness of the digital integrator 40 or for tailoring or configuring a single PWM controller integrated circuit product in different end use applications.

The disclosed digital integrator 40 concepts thus advantageously facilitate reduced integrated circuit die size and power consumption compared with analog integrator approaches, and avoid the need for an external integrator capacitor. In addition, the use of dual counter circuitry 54 in the integrator 40 mitigates or avoids loop stability issue seen in traditional analog integrator approaches, while compensating the close loop DC to DC converter control with respect to offsets in the modulator circuit, including loop compensator offsets, etc.

Figure 4:
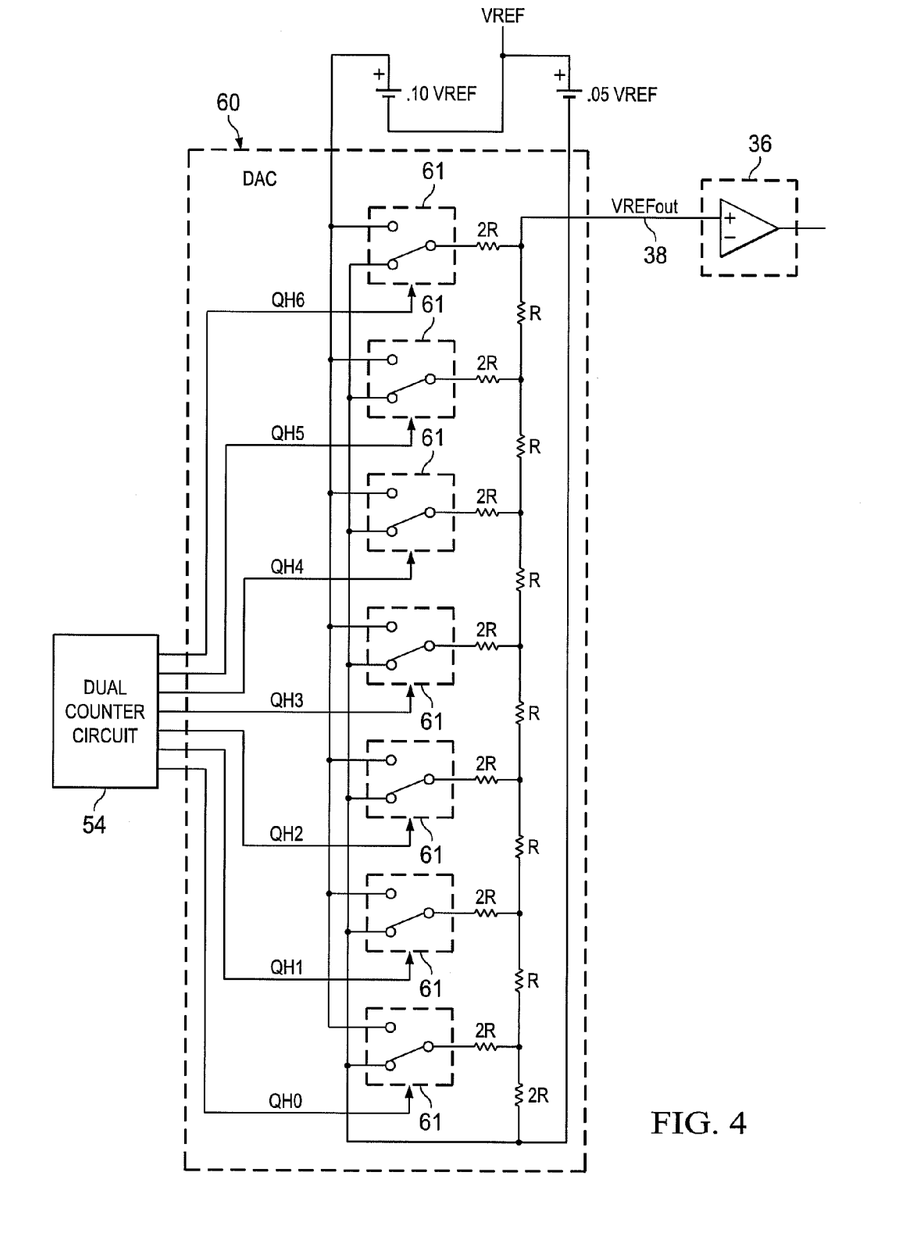
FIG. 4 is a schematic diagram illustrating a switched resistive divider digital to analog converter in the digital integrator.

FIG. 4 illustrates a resistive divider DAC circuit 60 which may be employed in certain embodiments. The DAC 60 in this embodiment includes seven switches 61 individually operative according to a corresponding one of the binary outputs of the second counter 104 (QH(6:0)) to selectively connect a corresponding resistor branch to the reference voltage VREF or to the circuit ground 3. Any suitable resistance values R and 2R may be used, with the illustrated example providing binary weighting, and certain embodiments may further include a capacitance (not shown) connected between the non-inverting loop comparator input 38 and the circuit ground 3 to facilitate signal stability and the compensated reference voltage VREFout. The illustrated example is a 7-bit R-2R ladder circuit providing $2^7$ possible analog voltage levels for the compensated reference voltage VREFout provided to the loop comparator 36 with binary weighting. The illustrated switched resistive divider circuit DAC 60, moreover, is but one possible embodiment, and any suitable form of digital to analog converter 60 may be used which operates to provide the compensated reference voltage VREFout based at least partially on the counter output (QH(6:0)) from the second counter 104 and the reference voltage VREF.

As further seen in FIG. 2, the digital integrator 40 further provides switches 106 and 108 for fast dynamic response during startup and/or other situations in which it is desirable to allow the digital integrator 40 to quickly respond. The first switch 106 operates according to the START signal received at the terminal 14 in a first state (normal operation) to connect the second clock input CLKH of the second counter 104 to the first logic output of the logic circuit 102, and in a second state (START signal activated) to connect the second clock input CLKH of the second counter 104 to the integrator circuit clock source 56 (CLK). Also, the second switch 108 operates in normal mode to connect the second up/down count input UPH of the second counter 104 to the second logic output of the logic circuit 102, and in startup mode (with the START signal active) to connect the second up/down count input UPH of the second counter 104 to the comparator output 49. Thus, when the START signal is activated, the second counter 104 operates as a single 7-bit binary counterproviding the seven bit output QH(6,0) to control the DAC 60 and thereby quickly respond to large differences between the reference signal from the resistive divider 42, 44 and the feedback signal FB via the integrator comparator 48. The START signal may be provided from an external source through a terminal 14 as illustrated, or may be internally generated (e.g., for operation upon startup of the PWM control circuitry and/ or based on other detected operating conditions, etc.) or combinations thereof in various embodiments.

Referring again to FIGS. 1 and 2, one or both of the counters 100 and 104 may include HOLD inputs, which can be provided with a hold control input signal 58 from an external source and/or from an internal source, such as an OCL detection circuit 47 shown in FIG. 2. The counters 100 and 104 in the illustrated example operate as described above in a normal or startup mode when the HOLD input is not activated to selectively update their respective counter bit outputs according to the corresponding clock inputs CLKL, CLKH and the corresponding up/down count input UPL, UPH. When the HOLD signal is activated (e.g., active high in one example), the counters 100 and 104 refrain from updating their respective counter bit outputs (they do not count up or down). In certain operating situations, this ability to essentially hold or "freeze" the value of the digital integrator 40 prevents or mitigates inaccuracy or instability in the closed loop operation of the PWM controller, particularly where the sensed output voltage and hence the feedback signal FB is known or assumed to be incorrect. For example, during transitions between CCM and DCM operation, overvoltage conditions or overcurrent limit situations (e.g., detected by the OCL detection circuit 47 in FIG. 2), actuation of the HOLD signal 58 may discontinue integration operation of the digital integrator 40 by freezing the output value of the second counter 104, thereby preventing potentially inaccurate adjustment of the compensated reference signal VREFout by the DAC 60, and allowing subsequent resumption using the saved or frozen counter values upon deactivation of the HOLD signal 58. Consequently, the ability to hold or freeze the output values of one or both of the counters 100 and 104 (or at least the second counter 104) enhances system stability. Moreover, the use of the digital integrator 40 allows more precise integrator value retention compared with analog integrator circuitry in which a voltage of an analog integrator capacitor suffers from leakage, thereby gradually losing the integrator value. Upon resumption of normal operation, the HOLD signal 58 in the illustrated embodiments can be deactuated, with the digital integrator 40 resuming operation from the previous state with no loss of integrator output information.

Figure 5:
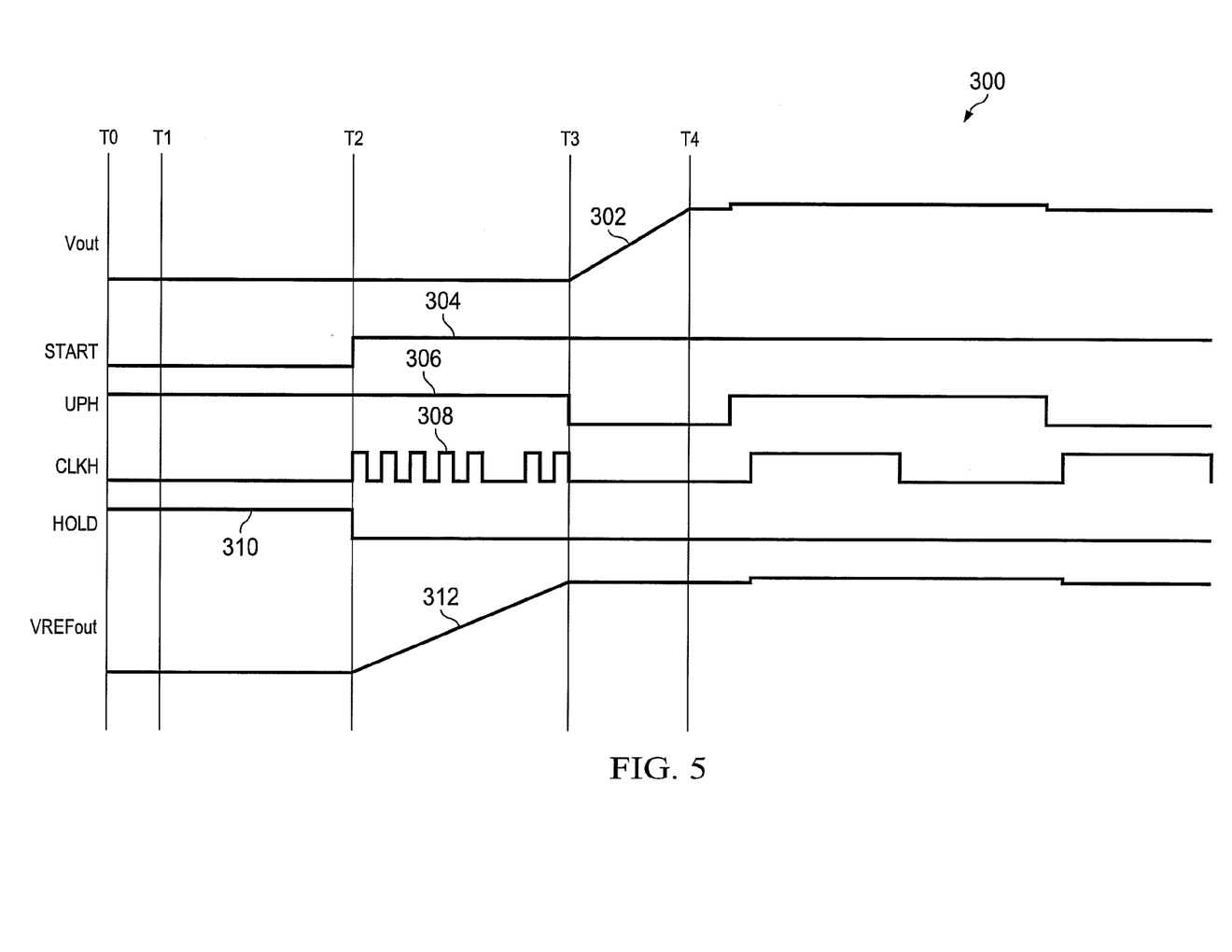
FIG. 5 is a waveform diagram illustrating various signal waveforms in the DC to DC converter of FIG. 1.

FIG. 5 provides a graph 300 illustrating various signal waveforms in operation of one embodiment of the DC to DC converter 10 of FIG. 1 with the system soft-start delayed until the digital integrator 140 is initialized. In this example, the output voltage Vout (curve 302 in FIG. 5) begins at 0 V at time T1 while the START signal 14 (curve 304) is initially active (low) and the HOLD signal 58 (curve 310 in FIG. 5) is initially active (high). In operation of the logic circuit 102 with the HOLD signal active, the second logic output (UPH, graph 306) remains high, and no clock pulses (CLKH) are applied to the second clock 104 by the first logic output with the START signal 14 active. After a predetermined time, or under external control, the HOLD and START signals are deactivated around time T2, and the second counter 104 (curve 308) begins to receive clock pulses while the corresponding up/down count input (UPH) signal is driven high through switch 108 by the comparator output 49. This causes increases in the counter output of the second counter 104, thereby increasing the compensated reference voltage VREFout (curve 312) through operation of the DAC 60 during digital integrator initialization from T2 to T3. System soft start begins a T3 once the feedback value FB is determined by the comparator 48 to exceed the integrator reference voltage, and the output voltage 302 ramps up from T3 to T4, with the digital integrator 40 slowly incrementing or decrementing the second counter 104 as seen in the curves 306 and 308 after time T4.

As shown in graph 300 of FIG. 5, therefore, the compensated reference voltage VREFout curve 312 is generally stable after T3, and changes only relatively infrequently as the dual counter circuit 54 and the operation of the logic circuit 102 effectively controls the time constant of the digital integrator 40 to avoid or mitigate excessive jitter in the compensated reference voltage used by the loop comparator 36 in operating the PWM control modulator circuitry. Moreover, the illustrated embodiments also provide fast initialization in addition to stable loop response during steady state operation, with the capability to hold or freeze the integrator operation during transients. The disclosed digital integrator concepts thus provide the capability of compensating circuit offsets for improved accuracy and DC to DC conversion, as well as reduced power consumption and integrated circuit die size together with elimination of external integrator capacitors, and improved stability and integrator value retention compared with analog integrator designs.

Figure 6:
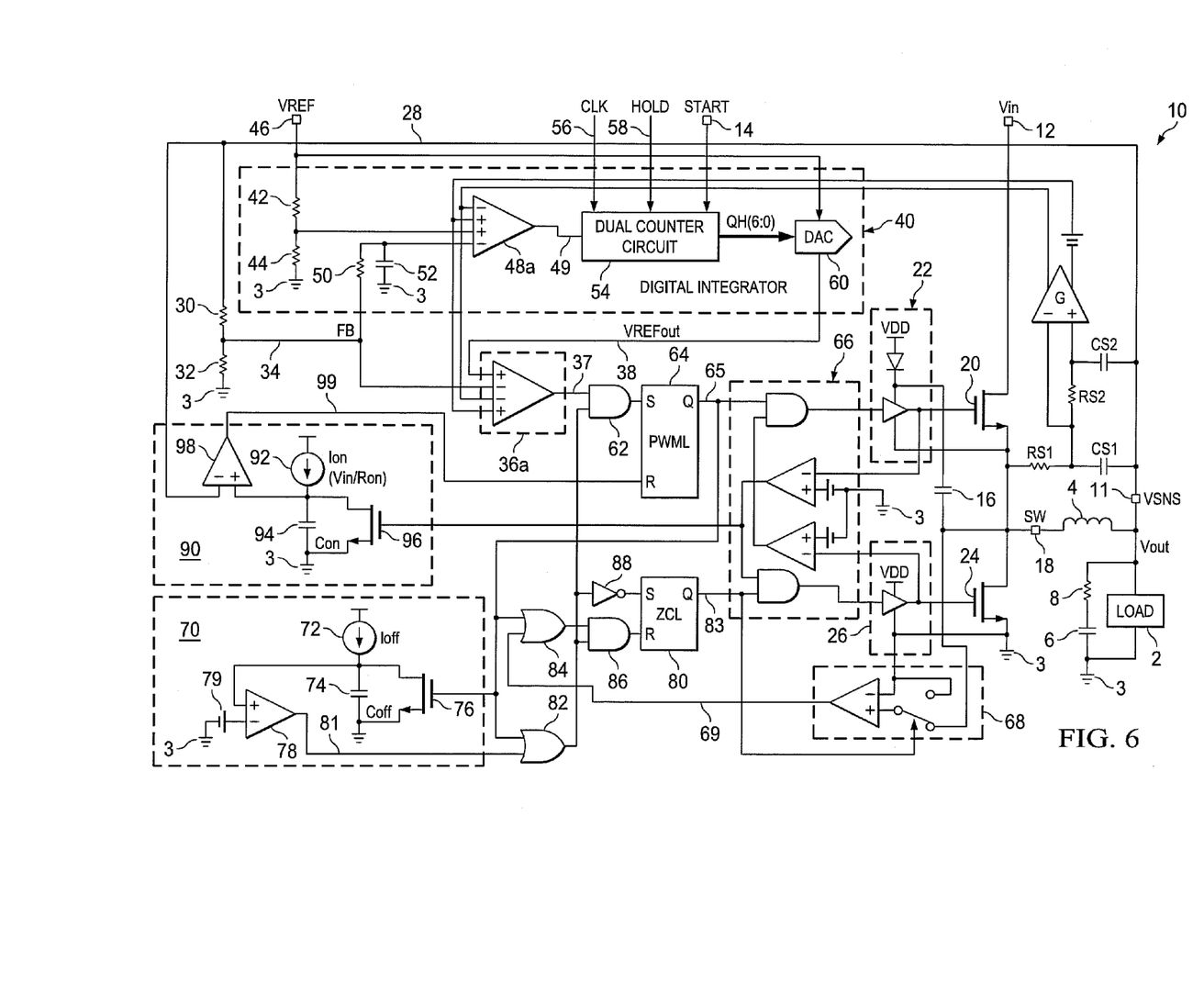
FIG. 6 is a schematic diagram illustrating another DC to DC converter with a dual counter digital integrator circuit providing a compensated reference voltage to a modulator circuit loop controller in accordance with one or more aspects of the present disclosure.

Another embodiment of the DC to DC converter 10 is shown in FIG. 6, including a digital integrator 140 and modulator as described above, where current feedback is provided via resistors RS1 and RS2 and capacitors CS1 and CS2 via a transconductance amplifier G to provide current ramp information to the loop comparator 36a and the integrator comparator 48a. In this embodiment, the loop comparator 36a includes a first input differential pair receiving the signal from the reference divider 42, 44 and the feedback from the RC circuit 50, 52, as well as a second input differential pair receiving a differential output from the transconductance amplifier G, with the current information being added to the feedback for comparison with the compensated reference signal VREFout. Also, the integrator comparator 48a has first and second differential pair inputs, with a first differential input pair receiving the FB signal and the compensated reference signal VREFout from the DAC 60, and a second differential input pair receiving the differential output from the transconductance amplifier G. In this embodiment, the added inputs to the comparators 36a and 48a provide current ramp information for enhanced loop stability. Moreover, the adjust range of the DAC 60 is preferable set to allow compensation for offsets in the main loop comparator 36a, the current ramp signal DC error, half the ripple error, and any divider ratio error.

Figure 7:
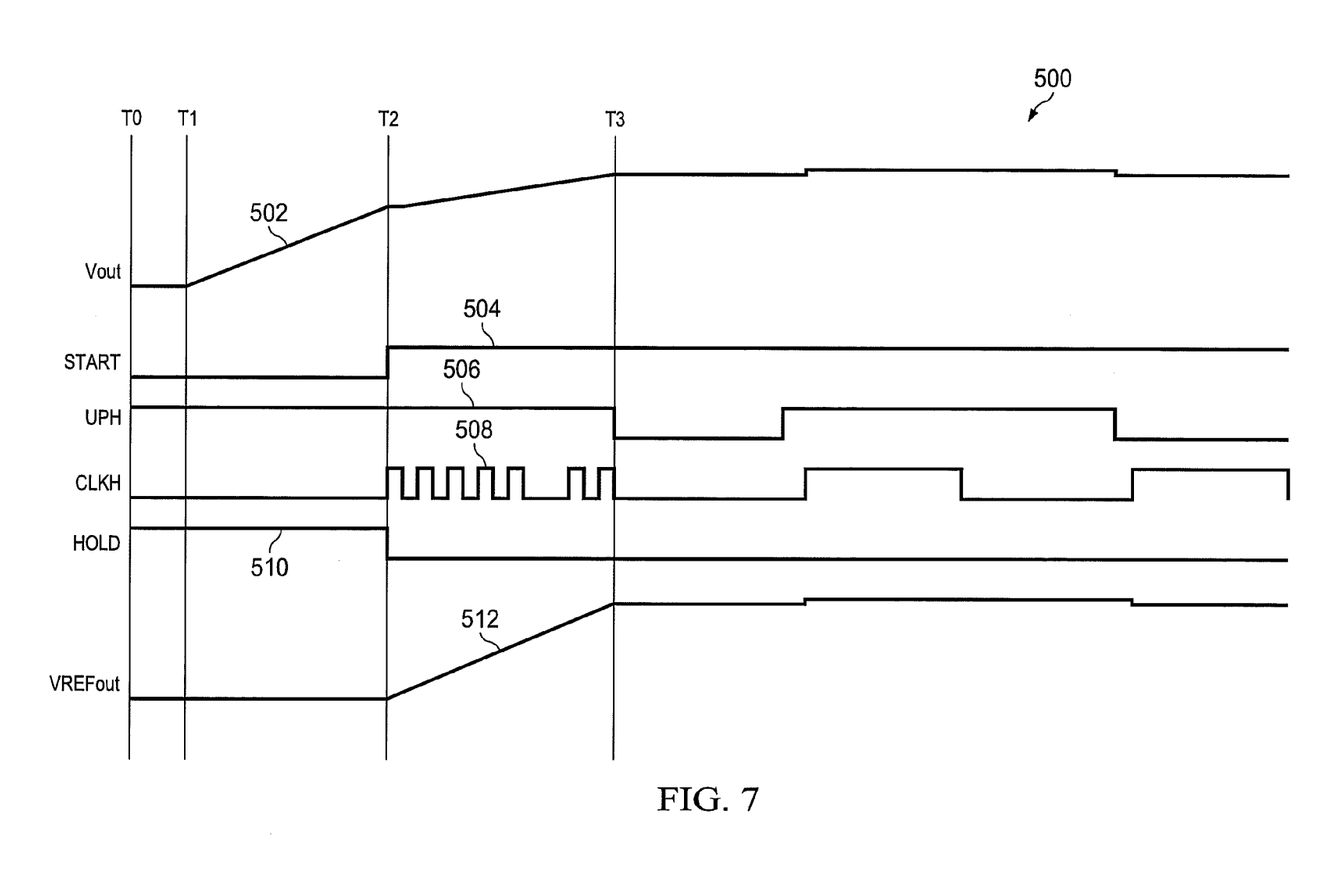
FIG. 7 is a waveform diagram illustrating various signal waveforms in the DC to DC converter of FIG. 6.

FIG. 7 shows a graph 500 illustrating various signal waveforms in operation of the DC to DC converter embodiment 10 of FIG. 6 where the digital integrator 140 is initialized after soft-start is finished. Since current ramp signal is valid when the system 10 finishes start-up, the digital integrator 140 can be initialized after soft-start finishes (but Vout is ready for loading) in one embodiment. In this example, the output voltage Vout (curve 502 in FIG. 7) begins at 0 V at time T1 and ramps up during a system soft-start period from T1 to T2 while the START signal 14 (curve 504) is initially active (low) and the HOLD signal 58 (curve 510 in FIG. 7) is initially active (high). In operation of the logic circuit 102 with the HOLD signal active, the second logic output (UPH, graph 506) remains high, and no clock pulses (CLKH) are applied to the second clock 104 by the first logic output with the START signal 14 active. After a predetermined time, or under external control, the HOLD and START signals are deactivated around time T2, and the second counter 104 (curve 508) begins to receive clock pulses while the corresponding up/down count input (UPH) signal is driven high through switch 108 by the comparator output 49 during initialization of the digital integrator 40 from T2 to T3. This causes increases in the counter output of the second counter 104, thereby increasing the compensated reference voltage VREFout (curve 512) through operation of the DAC 60, along with a ramped increase in the output voltage curve 502. Once the comparator 48 determines that the feedback value FB exceeds the integrator reference voltage, the digital integrator 40 slowly increments or decrements the second counter 104 as seen in the curves 506 and 508 after time T3. As shown in graph 500 of FIG. 7, therefore, the compensated reference voltage VREFout curve 512 is generally stable after T3, and changes only relatively infrequently as the dual counter circuit 54 and the operation of the logic circuit 102 effectively controls the time constant of the digital integrator 40.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A DC to DC converter, comprising:
 a switching circuit comprising at least one switch connected to a switching node;
 a modulator circuit providing a switching control signal to selectively actuate and deactuate the at least one switch to control an output voltage of a converter output node;
 a feedback circuit coupled with the converter output node to provide a feedback voltage signal based at least partially on the output voltage;
 a loop comparator circuit with a first comparator input connected to receive the feedback voltage signal, a second comparator input connected to receive a compensated reference signal, and a loop comparator output providing a loop comparator output signal to the modulator circuit to regulate the output voltage based on the feedback voltage signal and the compensated reference signal;
 a digital integrator circuit, comprising:
  a reference circuit providing an integrator reference voltage signal based at least partially on a reference voltage,
  a comparator circuit comprising a first input coupled with the reference circuit to receive the integrator reference voltage signal, a second input coupled with the feedback circuit to receive the feedback voltage signal, and a comparator output providing a binary comparator output signal indicating whether the reference voltage signal is greater than the feedback voltage signal, and
  a dual counter circuit, comprising:
   a multi-bit first counter comprising a first clock input coupled with an integrator circuit clock source, a first up/down count input coupled to receive the comparator output signal from the comparator circuit, and a plurality of first counter bit outputs providing signals indicating a multi-bit first counter output value,
   a multi-bit second counter comprising a second clock input, a second up/down count input, and a plurality of second counter bit outputs providing signals indicating a multi-bit second counter output value, and
   a logic circuit operative to initially increment or decrement the second counter responsive to the first counter bit outputs initially indicating a predetermined value of the first counter, and thereafter increment or decrement the second counter responsive to the first counter bit outputs again indicating the predetermined value after the first counter bit outputs transition in one direction through a full value range of the first counter; and
 a digital to analog converter with a plurality of inputs connected to the second counter bit outputs, and an output controlling the compensated reference signal provided to the second comparator input based at least partially on the second counter bit outputs and the reference voltage.

2. The DC to DC converter of claim 1, wherein the logic circuit comprises a plurality of inputs coupled with the first counter, a first logic output coupled with the second clock input, and a second logic output coupled with the second up/down count input, the logic circuit being operative to:
 set the first logic output to a first binary clock input state responsive to the first counter bit outputs indicating a first predetermined value of the first counter;
 set the first logic output to a second binary clock input state responsive to the first counter bit outputs indicating a second predetermined value of the first counter;
 set the second logic output to a first binary counter state responsive to the first counter bit outputs transitioning in a first direction to the second predetermined value of the first counter; and
 set the second logic output to a second binary counter state responsive to the first counter bit outputs transitioning in a second direction to the second predetermined value of the first counter.

3. The DC to DC converter of claim 2, wherein the dual counter circuit comprises:
 a first switch operative according to a control input in a first state to connect the second clock input of the second counter to the first logic output of the logic circuit, and in a second state to connect the second clock input of the second counter to the integrator circuit clock source; and
 a second switch operative according to the control input in a first state to connect the second up/down count input of the second counter to the second logic output of the logic circuit, and in a second state to connect the second up/down count input of the second counter to the comparator output.

4. The DC to DC converter of claim 3, wherein the first and second counters are individually operable according to a hold control input signal in a first mode to selectively update the first and second counters counter bit outputs according to the corresponding clock input and the corresponding up/down count input, and in a second mode to refrain from updating the first and second counters counter bit outputs.

5. The DC to DC converter of claim 2, wherein the first and second counters are individually operable according to a hold control input signal in a first mode to selectively update the first and second counters counter bit outputs according to the corresponding clock input and the corresponding up/down count input, and in a second mode to refrain from updating the first and second counters counter bit outputs.

6. The DC to DC converter of claim 1, wherein the dual counter circuit comprises:
   a first switch operative according to a control input in a first state to connect the second clock input of the second counter to the logic circuit, and in a second state to connect the second clock input of the second counter to the integrator circuit clock source; and
   a second switch operative according to the control input in a first state to connect the second up/down count input of the second counter to the logic circuit, and in a second state to connect the second up/down count input of the second counter to the comparator output.

7. The DC to DC converter of claim 6, wherein the first and second counters are individually operable according to a hold control input signal in a first mode to selectively update the first and second counters counter bit outputs according to the corresponding clock input and the corresponding up/down count input, and in a second mode to refrain from updating the first and second counters counter bit outputs.

8. The DC to DC converter of claim 1, wherein the first and second counters are individually operable according to a hold control input signal in a first mode to selectively update the first and second counters counter bit outputs according to the corresponding clock input and the corresponding up/down count input, and in a second mode to refrain from updating the first and second counters counter bit outputs.

9. A pulse width modulation controller, comprising:
   a reference compensation circuit providing a compensated reference signal at least partially according to a multi-bit digital input and a reference voltage;
   a loop comparator circuit providing a loop comparator output signal to a modulator circuit to control a power converter output voltage based on a feedback voltage signal and the compensated reference signal; and
   a digital integrator circuit, comprising a reference circuit providing an integrator reference voltage signal based at least partially on a reference voltage, a comparator circuit providing a binary comparator output signal indicating whether a reference voltage signal is greater than the feedback voltage signal, and a dual counter circuit, comprising:
      a first counter receiving the comparator output signal and an integrator clock input signal, and providing a multi-bit first counter value,
      a second counter comprising a second clock input, a second up/down count input, and providing the multi-bit digital input to the reference compensation circuit, and
      a logic circuit initially incrementing or decrementing the second counter based on the first counter value indicating a predetermined value, and thereafter selectively incrementing or decrementing the second counter responsive to the first counter value incrementing or decrementing through a predetermined multi-bit count range.

10. The PWM controller of claim 9, wherein the predetermined multi-bit count range is a full range of the first counter.

11. The PWM controller of claim 10, comprising:
   a first switch operative according to a control input in a first state to connect the second clock input to the logic circuit, and in a second state to connect the second clock input to the integrator clock input signal; and
   a second switch operative according to the control input in a first state to connect the second up/down count input to the logic circuit, and in a second state to connect the second up/down count input to the comparator output.

12. The PWM controller of claim 11, wherein the second counter comprises a hold control input for freezing the multi-bit digital input provided to the reference compensation circuit.

13. The PWM controller of claim 12, comprising an overcurrent limit circuit operative to selectively provide a hold signal to the hold control input of the second counter to freeze the multi-bit digital input provided to the reference compensation circuit when an overcurrent limit condition is detected.

14. The PWM controller of claim 9, comprising:
   a first switch operative according to a control input in a first state to connect the second clock input to the logic circuit, and in a second state to connect the second clock input to the integrator clock input signal; and
   a second switch operative according to the control input in a first state to connect the second up/down count input to the logic circuit, and in a second state to connect the second up/down count input to the comparator output.

15. The PWM controller of claim 14, wherein the second counter comprises a hold control input for freezing the multi-bit digital input provided to the reference compensation circuit.

16. The PWM controller of claim 15, comprising an overcurrent limit circuit operative to selectively provide a hold signal to the hold control input of the second counter to freeze the multi-bit digital input provided to the reference compensation circuit when an overcurrent limit condition is detected.

17. The PWM controller of claim 9, wherein the second counter comprises a hold control input for freezing the multi-bit digital input provided to the reference compensation circuit.

18. The PWM controller of claim 17, comprising an overcurrent limit circuit operative to selectively provide a hold signal to the hold control input of the second counter to freeze the multi-bit digital input provided to the reference compensation circuit when an overcurrent limit condition is detected.

19. The PWM controller of claim 9, wherein the reference compensation circuit comprises a switched resistive divider circuit with switches operated according to the multi-bit digital input to provide the compensated reference signal at least partially according to the multi-bit digital input and the reference voltage.

20. A digital integrator circuit for integrating an error between a reference voltage signal and a feedback voltage signal, comprising:
   a comparator circuit comprising a comparator output providing a binary comparator output signal indicating whether the reference voltage signal is greater than the feedback voltage signal;
   a first counter comprising a first clock input coupled with an integrator circuit clock source, a first up/down count input coupled to receive the comparator output signal, and a plurality of first counter bit outputs providing signals indicating a multi-bit first counter output value;
   a second counter comprising a second clock input, a second up/down count input, a plurality of second counter bit outputs providing signals indicating a multi-bit second counter output value, and a hold control input for freezing the second counter bit outputs;
   a logic circuit operative to initially increment or decrement the second counter responsive to the first counter bit outputs initially indicating a predetermined value, and thereafter increment or decrement the second counter only in response to the first counter bit outputs again indicating the predetermined value after the first counter bit outputs transition in one direction through a full value range of the first counter;

a first switch operative according to a control input in a first state to connect the second clock input of the second counter to the logic circuit, and in a second state to connect the second clock input of the second counter to the integrator circuit clock source; and a second switch operative according to the control input in a first state to connect the second up/down count input of the second counter to the logic circuit, and in a second state to connect the second up/down count input of the second counter to the comparator output.

* * * * *